United States Patent
Young et al.

(10) Patent No.: US 7,269,771 B1
(45) Date of Patent: Sep. 11, 2007

(54) SEMICONDUCTOR DEVICE ADAPTED FOR FORMING MULTIPLE SCAN CHAINS

(75) Inventors: Daniel B. Young, Beaverton, OR (US); Jeffrey S. Byrne, Portland, OR (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 684 days.

(21) Appl. No.: 10/676,536

(22) Filed: Sep. 30, 2003

(51) Int. Cl.
*G01R 31/28* (2006.01)
(52) U.S. Cl. ....................... 714/729; 714/727
(58) Field of Classification Search ........... 714/729, 714/727, 724, 34, 733; 326/41, 38; 314/34
See application file for complete search history.

(56) References Cited

U.S. PATENT DOCUMENTS

| | | | |
|---|---|---|---|
| 5,592,493 A * | 1/1997 | Crouch et al. ............ 714/729 |
| 5,635,855 A | 6/1997 | Tang | |
| 5,751,163 A | 5/1998 | Tang et al. | |
| 5,768,289 A * | 6/1998 | James ...................... 714/727 |
| 6,188,241 B1 * | 2/2001 | Gauthier et al. ............. 326/41 |
| 6,311,302 B1 * | 10/2001 | Cassetti et al. ............ 714/727 |
| 6,314,539 B1 * | 11/2001 | Jacobson et al. .......... 714/727 |
| 6,378,090 B1 * | 4/2002 | Bhattacharya .............. 714/724 |
| 6,701,476 B2 * | 3/2004 | Pouya et al. ................ 714/727 |
| 6,842,039 B1 * | 1/2005 | Guzman et al. ............. 326/38 |
| 6,886,110 B2 * | 4/2005 | O'Brien ...................... 714/34 |
| 6,990,618 B1 * | 1/2006 | Lulla et al. ................ 714/727 |

* cited by examiner

*Primary Examiner*—David Ton
(74) *Attorney, Agent, or Firm*—MacPherson Kwok Chen & Heid LLP; Jonathan W. Hallman

(57) ABSTRACT

A device includes data input and data output pins such as found in a JTAG port and a first plurality of boundary scan cells. The device is configurable to support a secondary boundary scan cells formed from the first plurality of boundary scan cells and a second plurality of boundary scan cells in at least one external device. In one embodiment, the device includes a demultiplexer which may be configured to support a primary boundary scan chain between the JTAG port and the first plurality of boundary scan cells. The demultiplexer may also be configured to support the secondary boundary scan chain between the JTAG port and the first and the second plurality of boundary scan cells.

27 Claims, 3 Drawing Sheets

SEMICONDUCTOR DEVICE ADAPTED FOR FORMING MULTIPLE SCAN CHAINS

TECHNICAL FIELD

The present invention relates generally to programming and/or testing of semiconductor devices in a boundary scan chain. Specifically, the present invention relates to the programming and/or testing of multiple semiconductor devices in a scan chain in which the devices are operable at different times, such as when they are powered up sequentially.

BACKGROUND

Modern electronic systems, which include a multiple of devices such as high-performance microprocessor and programmable logic devices, increasingly require a plurality of voltage levels. Care must be taken to power up and down the corresponding voltage rails that supply these voltages. Internal circuits suffer stress if certain power rails are active while others are inactive. In addition, microprocessors may suffer latch-up, which damages or destroys affected transistors. To prevent these problems, the multiple devices must be powered up and powered down in a proper sequence.

Power supply sequence controllers enable system designers to meet the need for power sequencing in their designs. A programmable sequence controller may include programmable logic that a user programs according to the particular power sequence control desired. An example programmable sequence controller is disclosed in U.S. Pat. No. 6,735,706, which is hereby incorporated by reference in its entirety.

A user will typically need to configure a programmable sequence controller and the devices it sequences. One very popular technique to configure and test electronic systems is known as boundary scan (BSCAN). Boundary scan techniques are standardized according to specifications such as IEEE-1149.1, also known as JTAG (Joint Test Action Group). In a JTAG or boundary-scan-enabled device, each input and output signal is supplemented with a multi-purpose memory element denoted as a boundary-scan cell. These cells are configured as a parallel-in, parallel-out shift register. The shift registers thus formed in each device or integrated circuit (IC) in the system are serially-connected in a daisy chain fashion such that test vectors may be shifted into and results shifted out of the system.

As part of the standardized boundary scan technique, each IC is required to include a JTAG port for access to the boundary-scan cells. Each JTAG port must, at a minimum, provide pins or I/O pads for the following signals: Test Data in (TDI), Test Data Out (TDO), Test Clock (TCK), and Test Mode Select (TMS). These pins or pads are coupled to a header on the circuit board (often denoted as a BSCAN or JTAG header) holding the IC. If there are multiple devices on a circuit board, they may be daisy-chained together to form a scan chain connected to the BSCAN header. One example of such an arrangement for programmable logic devices is shown and described in U.S. Pat. No. 5,635,855, which is hereby incorporated by reference. The configuration of BSCAN headers has been standardized into either a single row of eight pins or two rows of five pins each. To access the boundary-scan cells in a JTAG-enabled IC, a user physically couples a JTAG test cable to the BSCAN header on the board. But note the problem that arises if a BSCAN chain were to contain a programmable sequencer and the devices it controls. The programmable sequencer must be programmed before it is operational to supply power to the devices it controls. These other devices, lacking power, would thus not be active in the chain, and the chain would effectively be broken.

The conventional approach to this problem is to provide two BSCAN headers on the circuit board: one connected to the sequencer and the other connected to a BSCAN chain containing the devices controlled by the sequencer. Once the sequencer has been programmed through one BSCAN header and is supplying power to the other devices, the devices are programmed or tested through the other BSCAN header. However, the second BSCAN header increases costs and consumers scarce circuit board area.

Accordingly, there is a need in the art for a more effective approach for enabling the programming and/or testing of multiple devices in a scan chain that are operable at different times.

SUMMARY

In accordance with one aspect of the invention, a semiconductor device includes a plurality of boundary scan cells; and a demultiplexer; wherein the semiconductor device includes a first configuration wherein a primary boundary scan chain is formed using the plurality of boundary scan cells and a first output of the demultiplexer, and wherein the semiconductor device includes a second configuration wherein a secondary boundary scan chain is formed using the plurality of boundary scan cells, a plurality of boundary scan cells in at least one external device and a second output of the demultiplexer.

In accordance with another aspect of the invention, a method is provided including the acts of: providing a semiconductor device including a first plurality of boundary scan cells forming a shift register, a demultiplexer receiving the output of the shift register, a TDO pin, and a first I/O pin, and providing at least one external device having a second plurality of boundary scan cells; configuring the demultiplexer into a first configuration to couple the output of the shift register to the TDO pin such that a primary boundary scan chain is formed in just the first plurality of boundary scan cells; and configuring the demultiplexer into a second configuration to couple the output of the shift register to the first I/O pin, such that a secondary boundary scan chain is formed including both the first and the second plurality of boundary scan cells.

These and other aspects of the invention will become apparent from the following drawings and description.

DETAILED DESCRIPTION

The present invention provides a semiconductor device architecture that supports a BSCAN chain with other devices in a system without requiring multiple BSCAN headers. Although this architecture will be described with respect to a programmable logic device such as a power supply sequencer, it will be appreciated that the present invention is applicable to any semiconductor device that will be configured through a BSCAN header.

A programmable logic device will typically include a JTAG port having at least 4 pins or I/O pads to carry the four BSCAN signals: TDI, TDO, TCK, and TMS. The programmable device architecture described herein will require either one or two additional pins (as used herein, "pin" will refer to any lead used to carry signals into or out of the IC containing the programmable logic device). The one pin approach will be discussed first

Single Pin Embodiment

Figure 1:
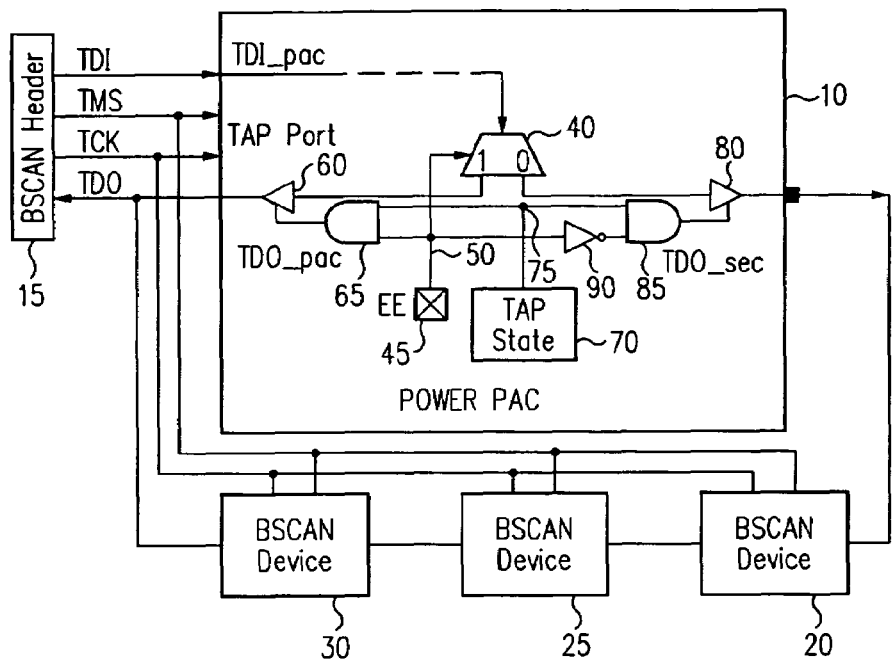
FIG. 1 is a schematic illustration of a programmable sequencer supporting a secondary boundary scan chain with one additional pin according to one embodiment of the invention.

A single pin logic device architecture is shown in FIG. 1. Programmable sequencer 10 couples to a BSCAN header 15. Programmable sequencer 10 controls the power sequencing of devices 20, 25, and 30. Sequencer 10 supports two BSCAN chains using BSCAN header 15. The first chain would comprise only the boundary scan cells (discussed with respect to FIG. 2a) within programmable sequencer 10. The second chain would comprise not only these cells but also the remaining boundary scan cells (discussed with respect to FIG. 2b) in devices 20, 25, and 30.

Figure 2A:
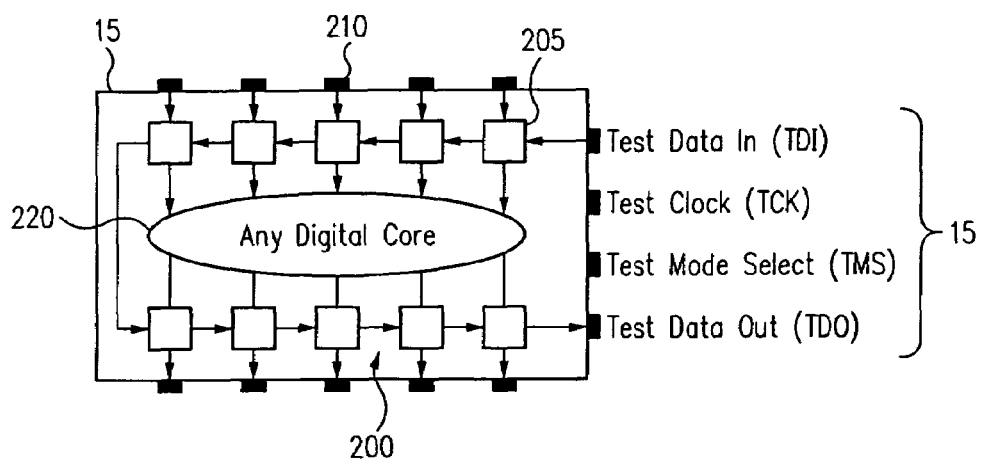
FIG. 2a is a schematic illustration of a primary boundary scan chain within the programmable sequencer of FIG. 1.

The problem of supporting multiple boundary scan chains using just a single BSCAN header 15 arises with respect to JTAG signals TDI and TDO. This may be illustrated with respect to FIGS. 2a and 2b. FIG. 2a illustrates the primary BSCAN chain 200 formed using just the boundary scan cells 205 within programmable sequencer 10. Not illustrated within programmable sequencer 10 are JTAG registers such as an instruction register and a bypass register and a Test Access Port (TAP) controller state machine. Digital core 220 represents the remaining non-JTAG core of programmable sequencer 10. Each BSCAN cell 205 associates with a pin 210. As can be seen for primary BSCAN chain 200, the only signal from BSCAN header 15 that will be serially shifted into primary BSCAN chain 200 is TDI. For example, TDI may comprise a digital word of length equaling the number of cells 205 within programmable sequencer 10. This word is serially shifted into cells 205 and then registered. In this manner, a user may configure BSCAN cells 205 as desired. The programmable sequencer may then be operated and signals from digital core 220 registered within BSCAN cells 205. Because of the serial linkage between BSCAN cells 205, the resulting contents of BSCAN cells 205 may be treated as a digital word having a length equal to the number of BSCAN cells within the chain 200. To observe the results of the operation, the digital word is serially shifted out of chain 200 as JTAG signal TDO.

Figure 2B:
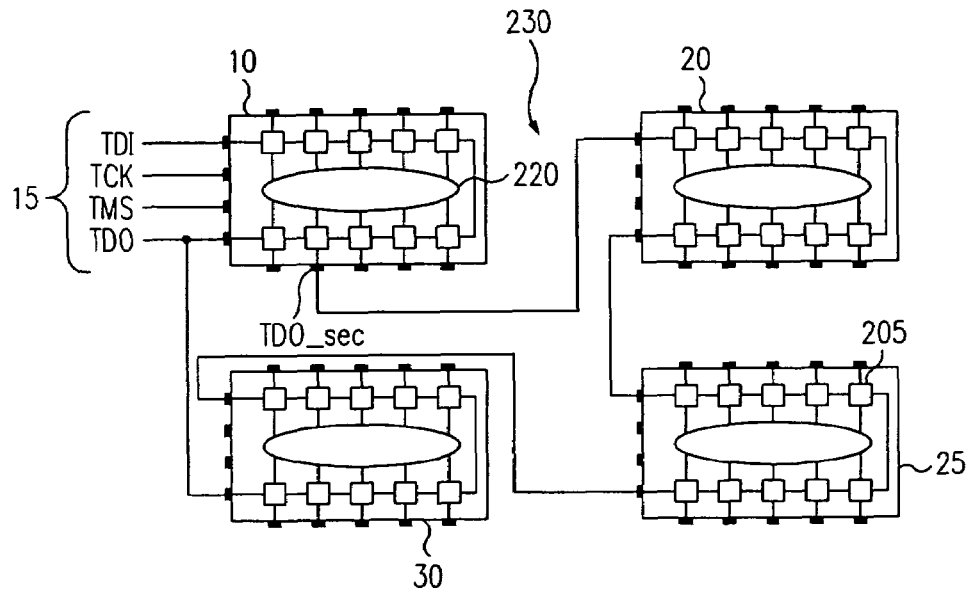
FIG. 2b is a schematic illustration of the secondary boundary scan chain supported by the programmable sequencer of FIG. 1.

FIG. 2b illustrates the secondary BSCAN chain 230 formed using the BSCAN cells 205 within programmable sequencer and those in devices 20, 25, and 30. Signals registered within BSCAN cells 205 may be serially shifted from programmable sequencer 10, through devices 20, 25, and 30, and back to the TDO pin in BSCAN header 15. During this serial shift, the signals previously registered within BSCAN cells 205 in devices 20, 25, and 30 would also be shifted out the TDO pin in BSCAN header 15. As can be seen from FIGS. 2b and 1, programmable sequencer 10 must provide four pins to couple to BSCAN header 15. In addition, another pin denoted as TDO_sec will couple signals from programmable sequencer 10 to the subsequent device (in this case, device 20) in secondary BSCAN chain 230. It is pin TDO_sec that is the additional pin necessary in the first pin embodiment as will be described further with respect to FIG. 1.

As seen in FIG. 1, programmable sequencer 10 includes a 1:2 demultiplexer 40 controlled by a memory cell such as electrically erasable (EE) configuration memory cell 45. Alternatively, memory cell may comprise a flip-flop. Depending upon the binary state of the signal 50 stored by cell 45, programmable sequencer 10 will either support primary BSCAN chain 200 or secondary BSCAN chain 230 through BSCAN header 15. Should memory cell 45 comprise a flip-flop, the flip-flop may be configured to respond to a power-on reset command to select for primary BSCAN chain 200. Demultiplexer 40 is positioned to receive the output from the last BSCAN cell 205 in programmable sequencer 10 in both primary BSCAN chain 200 or second BSCAN chain 230 (it is the same BSCAN cell 205 for both chains). In addition, demultiplexer 40 is positioned within either chain past the path to the JTAG registers discussed earlier. Arbitrarily, demultiplexer 40 has been configured so that it will support primary BSCAN chain 200 when signal 50 is in the high binary state (a logical "1"). Should signal 50 be in the high binary state, demultiplexer 40 will direct the signal from the last BSCAN cell 205 in programmable sequencer 10 to the TDO pin in BSCAN header 15. Alternatively, should signal 50 be in the low binary state (a logical "0"), demultiplexer 40 will direct the signal from the last BSCAN cell 205 in programmable sequencer 10 to the TDO_sec pin. As seen in FIG. 2b, this pin exists within the secondary BSCAN chain 230 signal path such that secondary BSCAN chain 230 is supported when signal 50 is in the low binary state.

Because both primary BSCAN chain 200 and second BSCAN chain 230 end at the TDO pin in BSCAN header 15, there is the possibility of TDO pin contention. Accordingly, demultiplexer 40 may couple to the TDO pin through a tri-state buffer 60. To provide the logic for its control, tri-state buffer 60 may be controlled by the output of an AND gate 65. In turn, AND gate receives signal 50 and an output 75 of the TAP state machine 70 discussed earlier. This output 75 of TAP state machine 70 will be a logical 1 whenever TAP state machine 70 is in the states that support signal flow through the TDO pin (such states will be denoted herein collectively as the BSCAN state). Thus, assuming TAP state machine 70 is in a state that supports this signal flow, the state of signal 50 will control whether tri-state buffer 60 is in the high impedance mode. The control of tri-state buffer 60 is such that when the output of AND gate 65 is a logical 1, tri-state buffer 60 is not in the high impedance mode. Conversely, when the output of AND gate 65 is a logical 0, tri-state buffer 60 is in the high impedance mode. A second tri-state buffer 80 coupled to the TDO_sec pin has a similar effect in the secondary BSCAN chain 230 path.

Tri-state buffer 80 is controlled by an AND gate 85. AND gate 85 receives output 75 of TAP state machine 70 as well as an inverted version of signal 50 provided by an inverter 90. Thus, when TAP state machine 70 is in the BSCAN state and signal 50 is a logical 0, the output of demultiplexer 40 will flow through the TDO_sec pin within the signal path of secondary BSCAN chain 230. Tri-state buffer 80 is controlled such that it is in the high-impedance state when the output of AND gate 85 is a logical 0.

So long as the state of memory cell 45 is not changed during secondary BSCAN chain 230 operation, tri-state buffer 60 will prevent any chance of TDO pin contention between programmable sequencer 10 and device 30. However, it is possible that the state of memory cell 45 might change during secondary BSCAN chain 230 operation because of some unexpected event. In such a case, programmable sequencer 10 may be driving the TDO pin to a first logical state while the output of secondary BSCAN chain 230 from device 30 is driving the TDO to an opposite logical state, thereby causing TDO pin contention and faulty operation. The second pin embodiment that will be described next prevents such a pin contention possibility.

Two Pin Embodiment

Figure 3:
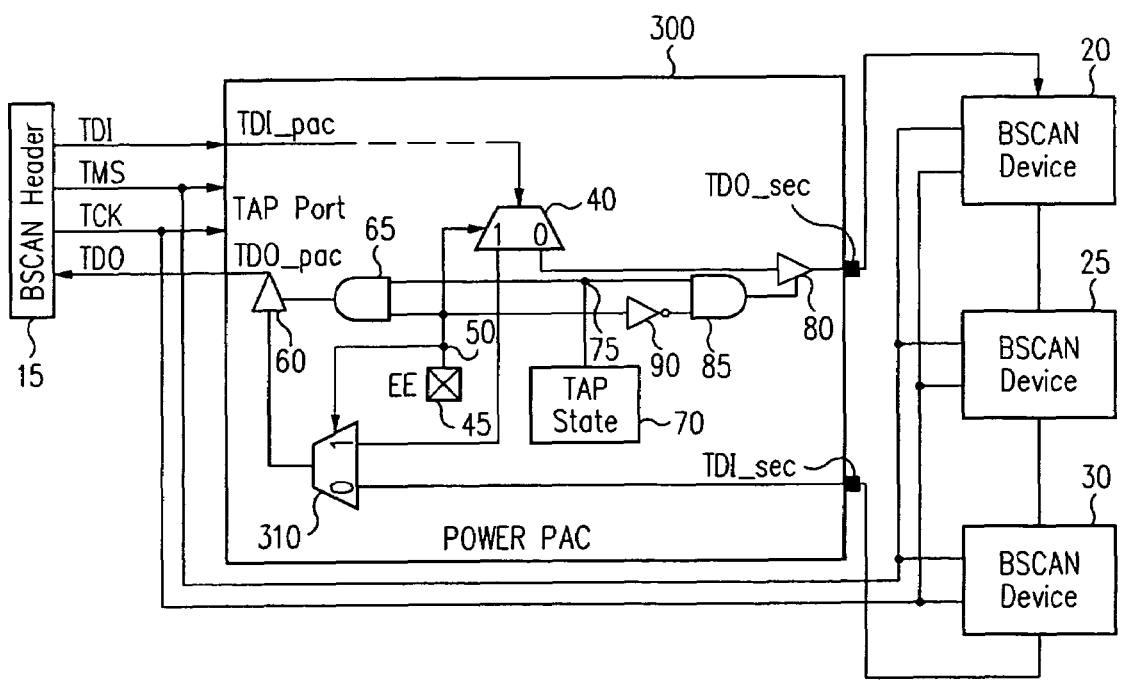
FIG. 3 is a schematic illustration of a programmable sequencer supporting a secondary boundary scan chain using two additional pins according to one embodiment of the invention.
Figure 4:
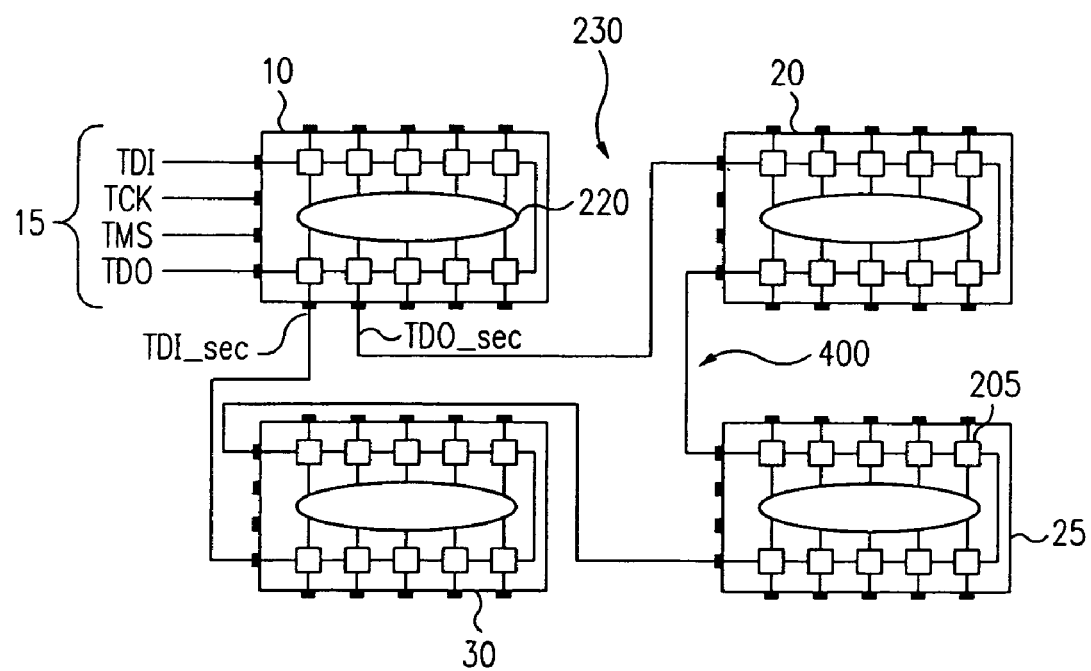
FIG. 4 is a schematic illustration of the secondary boundary scan chain supported by the programmable sequencer of FIG. 3.

A second pin programmable device architecture is shown in FIG. 3. A programmable sequencer 300 couples to BSCAN header 15 and controls the power sequencing of devices 20, 25, and 30 analogously as described with respect to FIG. 1. However, the configuration of a secondary BSCAN chain 400 is different for the two-pin embodiment as seen in FIG. 4. In this embodiment, the signal path for secondary BSCAN chain 400 through programmable sequencer 300 to device 20 is analogous to the path described with respect to FIG. 1. However, secondary BSCAN chain 400 does not couple directly to the TDO pin of BSCAN header 15 from device 30 as described with respect to FIG. 2b. Instead, secondary BSCAN chain 400 couples from device 30 into an additional pin TDI_sec on programmable sequencer 300. Thus, in addition to possessing the four pins coupled to BSCAN header 15 and possessing a TDO_sec pin, programmable sequencer requires the additional pin TDI_sec. Programmable sequencer 300 may be said to be a "two-pin" embodiment in that it includes the two pins TDI_sec and TDO_sec in addition to the conventional pins required for coupling to BSCAN header 15.

To prevent the possibility of TDO pin contention, programmable sequencer 300 includes a multiplexer 310 in addition to demultiplexer 40. As discussed with respect to FIG. 1, demultiplexer 40 is positioned within both the primary and secondary BSCAN chain signal path past the path to the JTAG registers within programmable sequencer 300. Demultiplexer 40 is controlled by a configuration memory cell such as EE cell 45 as discussed earlier. Alternatively, demultiplexer 40 may be controlled by the state of a flip-flop as also described herein. Thus, when demultiplexer 40 is controlled by signal 50 to select for the primary BSCAN path, the output of demultiplexer 40 will be received by multiplexer 310. Multiplexer 310 is also under the control of signal 50 to select for the output of demultiplexer 40 when signal 50 is a logical 1. It will be appreciated, however, that multiplexer 310 may be under the control of a separate configuration memory cell so long as its activation is coordinated with that for EE cell 45. Multiplexer 310 also receives the signal carried on the TDI_sec pin. When signal 50 is a logical 0, multiplexer 310 will select for this signal to complete the secondary BSCAN chain 400 (FIG. 4). Tri-state buffer 60 receives the output of multiplexer 310 and couples it to the TDO pin when not tri-stated by the output of AND gate 65 as discussed previously. Thus, the TDO pin can never be in contention between the primary BSCAN chain and the secondary BSCAN chain because of multiplexer 310 and the additional pin TDI_sec.

The above-described embodiments of the present invention are merely meant to be illustrative and not limiting. For example, although described with respect to a programmable sequencer, the present invention is fully applicable to a logic device which will be included within a boundary scan chain with other devices but will be powered-up separately from these other devices. Moreover, the order of described herein be varied to some degree. It will thus be understood by those skilled in the art that various changes and modifications may be made to the embodiments described without departing from the principles of this invention. The appended claims are intended to encompass all such changes and modifications as fall within the true spirit and scope of this invention

What is claimed is:

1. A semiconductor device, comprising:
a plurality of boundary scan cells; and
a demultiplexer; wherein the semiconductor device includes a first configuration wherein a primary boundary scan chain is formed using the plurality of boundary scan cells and a first output of the demultiplexer, and wherein the semiconductor device includes a second configuration wherein a secondary boundary scan chain is formed using the plurality of boundary scan cells, a plurality of boundary scan cells in at least one external device and a second output of the demultiplexer.

2. The semiconductor device of claim 1 wherein the semiconductor device is a programmable power sequence controller.

3. The semiconductor device of claim 1, further comprising a configuration memory cell, wherein the state of the configuration memory cell controls whether the semiconductor device is in the first configuration or the second configuration.

4. The semiconductor device of claim 1, further comprising a JTAG port having a TDI and a TDO pin, wherein the primary boundary scan chain extends from the TDI pin, through the plurality of boundary scan cells in the semiconductor device to the first output of the demultiplexer, and from the first output of the demultiplexer to the TDO pin.

5. The semiconductor device of claim 4, further comprising a first I/O pin, wherein the secondary boundary scan chain extends from the TDI pin, through the plurality of boundary scan cells in the semiconductor device to the second output of the demultiplexer, from the second output of the demultiplexer to the first I/O pin, from the first I/O pin through the plurality of boundary scan cells in the at least one external device.

6. The semiconductor device of claim 5, wherein the first output of the demultiplexer couples to the TDO pin through a tri-state buffer.

7. The semiconductor device of claim 5, further comprising a second I/O pin, wherein the secondary boundary scan chain extends from the plurality of boundary scan cells in the at least one external device through the second I/O pin to the TDO pin.

8. The semiconductor device of claim 7, further comprising a multiplexer having an output coupled to the TDO pin, the multiplexer having a first input coupled to the second I/O pin and a second input coupled to the first output of the demultiplexer, wherein in the first configuration, the multiplexer is configured to select for the second input, and wherein in the second configuration, the multiplexer is configured to select for the first input.

9. The semiconductor device of claim 8, wherein the output of the multiplexer couples to the TDO pin through a tri-state buffer.

10. The semiconductor device of claim 1, wherein the at least one external device comprises a plurality of external devices, and wherein the semiconductor device comprises a programmable sequencer operable to control the power sequencing of the plurality of external devices.

11. A method, comprising:
providing a semiconductor device including a first plurality of boundary scan cells forming a shift register, a demultiplexer receiving the output of the shift register, a TDO pin, and a first I/O pin, and providing at least one external device having a second plurality of boundary scan cells;
configuring the demultiplexer into a first configuration to couple the output of the shift register to the TDO pin such that a primary boundary scan chain is formed in just the first plurality of boundary scan cells; and
configuring the demultiplexer into a second configuration to couple the output of the shift register to the first I/O pin, such that a secondary boundary scan chain is formed including both the first and the second plurality of boundary scan cells.

12. The method of claim 11, further comprising:
providing a second I/O pin and a multiplexer for the semiconductor device, the multiplexer having a first input coupled to an output of the demultiplexer and having a second input coupled to the second I/O pin;
when the demultiplexer is in the first configuration, configuring the multiplexer to couple its first input to the TDO pin; and
when the demultiplexer is in the second configuration, configuring the multiplexer to couple its second input to the TDO pin.

13. A device, wherein the device is configurable to form a secondary boundary scan chain with a first plurality of boundary scan cells within at least one external device, comprising:
a second plurality of boundary scan cells;
a TDI pin;
a TDO pin; and
means for forming a primary boundary scan chain between the TDI pin and the TDO pin including only the secondary plurality of boundary scan cells and for forming a secondary boundary scan chain between the TDI pin and the TDO pin including the first and the second plurality of boundary scan cells.

14. The device of claim 13, wherein the means includes a configuration memory cell, the state of the configuration memory cell controlling whether the primary or the secondary boundary scan chain is formed.

15. The device of claim 14, wherein the means includes a demultiplexer controlled by the state of the configuration memory cell.

16. The device of claim 15, wherein the means forms the secondary boundary scan chain using a first I/O pin.

17. The device of claim 16, wherein the means further forms the secondary boundary scan chain using a second I/O pin.

18. A semiconductor device, comprising:
a data input pin adapted to receive configuration and/or test data;
first and second data output pins adapted to transmit configuration and/or test data; and
a plurality of scan cells forming a scan chain,
wherein the semiconductor device is configurable to couple the scan chain between the data input pin and the first data output pin in a first configuration and to couple the scan chain between the data input pin and the second data output pin in a second configuration.

19. The semiconductor device of claim 18 wherein the semiconductor device includes a JTAG port, the data input being a TDI pin and one of the data output pins being TDO pins.

20. The semiconductor device of claim 18, wherein the semiconductor device is a programmable logic device.

21. The semiconductor device of claim 18, wherein the semiconductor device is a programmable power supply sequence controller.

22. The semiconductor device of claim 18 including a second data input pin adapted to receive configuration and/or test data from a second device, the second data input pin coupled to the first data output pin with the semiconductor device in the second configuration.

23. The semiconductor device of claim 18, wherein the semiconductor device is a first logic device, and the second data output pin of the first logic device is coupled to a data input pin of a second logic device, the first logic device forming a first scan chain in the first configuration and the first and second logic devices forming a second scan chain in the second configuration.

24. The logic device of claim 23, wherein the first logic device includes a second data input pin coupled to a data output pin of the second logic device, the second data input pin adapted to receive configuration and/or test data from the second logic device in the second configuration.

25. A method of programming and/or testing semiconductor devices using scan chains, the method comprising:
powering up a first semiconductor device;
configuring the first semiconductor device to create a first scan chain that excludes a second semiconductor device that has not yet been powered up;
programming and/or testing the first semiconductor device using the first scan chain;
powering up the second semiconductor device;
configuring the first semiconductor device to create a second scan chain that includes the first and second semiconductor devices; and
programming and/or testing at least the second semiconductor device using the second scan chain.

26. The method of claim 25 wherein the first semiconductor device controls the powering up of the second semiconductor device.

27. The method of claim 25 wherein the acts are executed in the order recited.

* * * * *